United States Patent
Cao et al.

(10) Patent No.: US 11,532,643 B2
(45) Date of Patent: Dec. 20, 2022

(54) ARRAY SUBSTRATE, MANUFACTURING METHOD THEREOF, DISPLAY PANEL

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Binbin Cao, Beijing (CN); Yinhu Huang, Beijing (CN); Chengshao Yang, Beijing (CN); Haijiao Qian, Beijing (CN)

(73) Assignees: BEIJING BOE TECHNOLOGY DEVELOPMENT CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 796 days.

(21) Appl. No.: 16/096,587

(22) PCT Filed: Mar. 12, 2018

(86) PCT No.: PCT/CN2018/078681
§ 371 (c)(1),
(2) Date: Oct. 25, 2018

(87) PCT Pub. No.: WO2018/210041
PCT Pub. Date: Nov. 22, 2018

(65) Prior Publication Data
US 2020/0335523 A1    Oct. 22, 2020

(30) Foreign Application Priority Data
May 16, 2017    (CN) .......................... 201710344384.2

(51) Int. Cl.
*H01L 27/12* (2006.01)
*G02F 1/1362* (2006.01)

(52) U.S. Cl.
CPC ...... *H01L 27/124* (2013.01); *G02F 1/136286* (2013.01); *H01L 27/1285* (2013.01)

(58) Field of Classification Search
CPC ............... H01L 27/124; H01L 27/1285; H01L 27/1281; G02F 1/136286
See application file for complete search history.

(56) References Cited

U.S. PATENT DOCUMENTS

| 2012/0162585 A1* | 6/2012 | Liu ...................... H01L 27/1288 |
| | | 257/E21.616 |
| 2012/0171822 A1* | 7/2012 | Yuan ................... H01L 21/0274 |
| | | 438/166 |

(Continued)

FOREIGN PATENT DOCUMENTS

CN    102290413        12/2011
CN    102290413 A   *  12/2011
(Continued)

OTHER PUBLICATIONS

PCT International Search Report and Written Opinion issued for corresponding PCT International Application No. PCT/CN2018/078681, dated May 18, 2018 (11 pages).

(Continued)

*Primary Examiner* — S M Sohel Imtiaz
(74) *Attorney, Agent, or Firm* — Myers Bigel, P.A.

(57) ABSTRACT

An array substrate, a manufacturing method thereof, and a display panel are provided. The array substrate comprises a base substrate, a plurality of gate lines and gate electrodes on the base substrate, each gate electrode being corresponding to and separate from a respective gate line, a gate insulating layer over the gate electrode and the gate line, the gate insulating layer having a first via hole and a second via hole, the first via hole exposing the gate electrode, the second via hole exposing the gate line, a conductive connection layer and a polysilicon semiconductor layer on the gate insulating layer, the conductive connection layer filling the first via hole and the second via hole to connect the gate line with the gate electrode.

14 Claims, 2 Drawing Sheets

(56) References Cited

U.S. PATENT DOCUMENTS

| | | | |
|---|---|---|---|
| 2015/0270408 A1 | 9/2015 | Song | |
| 2016/0020333 A1* | 1/2016 | Gao | H01L 21/31 438/155 |
| 2016/0322388 A1* | 11/2016 | Ma | H01L 29/45 |
| 2017/0256631 A1* | 9/2017 | Min | H01L 21/28008 |

FOREIGN PATENT DOCUMENTS

| | | |
|---|---|---|
| CN | 104867972 | 8/2015 |
| CN | 105609422 | 5/2016 |
| CN | 107425014 | 12/2017 |

OTHER PUBLICATIONS

PCT International Search Report and Written Opinion issued for corresponding PCT International Application No. PCT/CN2018/078681, dated May 18, 2018 (16 pages with English language translation).

First Chinese Office Action corresponding to Chinese Patent Application No. 201710344384.2 dated Feb. 25, 2019. (13 pages with English translation).

\* cited by examiner

ARRAY SUBSTRATE, MANUFACTURING METHOD THEREOF, DISPLAY PANEL

RELATED APPLICATION

The present application is a 35 U.S.C. 371 national stage application of PCT International Application No. PCT/CN2018/078681 filed on Mar. 12, 2018, which claims the benefit of Chinese Patent Application No. 201710344384.2, filed on May 16, 2017, the entire disclosure of which is incorporated herein by reference.

TECHNICAL FILED

The present disclosure relates to the field of display technologies, and especially to an array substrate, a manufacturing method thereof, and a display panel.

BACKGROUND

Thin film transistors (TFTs) applied to TFT liquid crystal displays (LCDs) mainly include amorphous silicon thin film transistors (a-Si TFTs) and polysilicon thin film transistors (Poly-Si TFTs). Polysilicon can mainly be classified as high temperature polysilicon (HTPS) and low temperature polysilicon (LTPS).

Amorphous silicon has many unavoidable shortcomings such as low mobility and low stability, whereas low temperature polysilicon has higher mobility and stability, and its mobility is even tens or hundreds of times that of amorphous silicon. Therefore, the technology of forming a thin film transistor using a low temperature polysilicon material has been rapidly developed, and a new generation LCD or OLED (Organic Light-Emitting Diode) derived from LTPS has become an important display technology, especially an OLED display device.

SUMMARY

An embodiment of the present disclosure provides an array substrate, which comprises: a base substrate, a plurality of gate lines and gate electrodes on the base substrate, each gate electrode being corresponding to and separate from a respective gate line, a gate insulating layer over the gate electrodes and the gate lines, the gate insulating layer having a first via hole and a second via hole, the first via hole exposing the gate electrode, the second via hole exposing the gate line; a conductive connection layer and a polysilicon semiconductor layer on the gate insulating layer, the conductive connection layer filling the first via hole and the second via hole so as to connect the gate line to the gate electrode.

In some embodiments, the array substrate further comprises a source/drain on the polysilicon semiconductor layer.

In some embodiments, the conductive connection layer and the source/drain are disposed in a same layer.

In some embodiments, the gate electrode and the gate line are disposed in a same layer.

In some embodiments, the polysilicon semiconductor layer is a p-type polysilicon semiconductor layer, and the array substrate further comprises a first amorphous silicon semiconductor layer and an n-type polysilicon semiconductor layer above the polysilicon semiconductor layer.

In some embodiments, an orthographic projection of the polysilicon semiconductor layer on the base substrate at least partially overlaps that of the gate electrode on the base substrate.

Another embodiment of the present disclosure provides a display panel comprising the array substrate according to any of the foregoing embodiments.

A further embodiment of the disclosure provides a manufacturing method for an array substrate, comprising:

forming a plurality of gate lines and gate electrodes on a base substrate, each gate electrode being corresponding to and separate form a respective gate line; forming a gate insulating layer over the gate electrodes and the gate lines, the gate insulating layer including a first via hole for exposing the gate electrode and a second via hole for exposing the gate line, and forming a polysilicon semiconductor layer on the gate insulating layer.

In some embodiments, the method further comprises: forming a source/drain on the polysilicon semiconductor layer; forming a conductive connection layer on the gate insulating layer, the conductive connection layer filling the first via hole and the second via hole so as to connect the gate line with the gate electrode.

In some embodiments, a step of forming a gate insulating layer comprises: forming, by a patterning process, a gate insulating layer including the first via hole and the second via hole.

In some embodiments, the step of forming a gate insulating layer comprises: forming an insulating film covering the gate electrode and the gate line; etching the insulating film to obtain the first via hole exposing the gate electrode and the second via hole exposing the gate line.

In some embodiments, the step of forming a polysilicon semiconductor layer on the gate insulating layer comprises: forming, by a patterning process, a second amorphous silicon semiconductor layer on the gate insulating layer; performing a local laser annealing process on a region in the second amorphous silicon semiconductor layer corresponding to the gate electrode to form the polysilicon semiconductor layer.

In some embodiments, the local laser annealing process is a microlens array (MLA) local laser annealing process.

In some embodiments, the conductive connection layer is formed on the gate insulating layer by a same patterning process while the source/drain is being formed.

In some embodiments, the polysilicon semiconductor layer is a p-type polysilicon semiconductor layer, and the method further comprises forming a first amorphous silicon semiconductor layer and an n-type polysilicon semiconductor layer on the p-type polysilicon semiconductor layer.

DETAILED DESCRIPTION OF EMBODIMENTS

The technical solutions of the disclosure will be clearly and completely described below with reference to the accompanying drawings. It is clear that the described embodiments are part of the possible embodiments of the disclosure, rather than all of them. All other embodiments obtained by a person having an ordinary skill in the art based on the embodiments herein without inventive efforts fall within the scope of the disclosure.

Generally, the process for forming a polysilicon semiconductor layer includes forming an amorphous silicon semiconductor layer, and then performing a local laser annealing process on the amorphous silicon layer such that a region in the amorphous silicon semiconductor layer corresponding to the gate electrode is converted into a polysilicon semiconductor layer. Melt crystallization can be completed by a single laser irradiation, which can improve the mobility of the semiconductor device.

The inventors of the application have recognized that, since the metal has high heat transfer efficiency and the gate lines connected to the gate electrodes are spread over the entire display panel, heat irradiated onto the amorphous silicon semiconductor layer will be transferred to the gate electrodes, and the heat will be further dispersed to respective regions of the display panel through the gate lines connected to the gate electrodes, so that the laser energy is low in efficiency for converting the amorphous silicon semiconductor layer, and the crystallization effect is poor.

Figure 1:
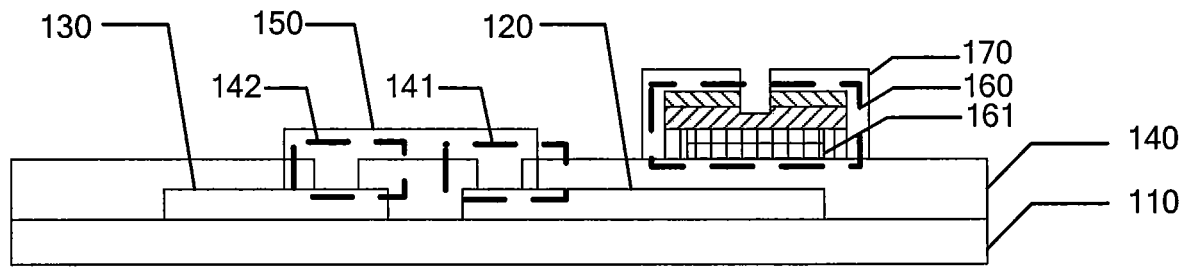
FIG. 1 is a partial sectional view of an array substrate provided by an embodiment of the disclosure.

In order to improve the utilization efficiency of the laser for converting polysilicon and enhance the conversion effect of polysilicon, an embodiment of the disclosure provides an array substrate, referring to FIG. 1, comprising a base substrate 110, multiple gate lines 130 on the base substrate 110 (a section view of one gate line 130 is illustrated in FIG. 1, which is perpendicular to a longitudinal extension direction thereof), a gate electrode 120 that is corresponding to and separate from the gate line 130, a gate insulating layer 140 over the gate electrode 120 and the gate line 130, and a first via hole 141 and a second via hole 142 in the gate insulating layer 140. The first via hole 141 exposes the gate electrode 120, and the second via hole 142 exposes the gate line 130. The array substrate further comprises a conductive connection layer 150 and a polysilicon semiconductor layer 161 on the gate insulating layer 140, and a source/drain 170 above the polysilicon semiconductor layer 161. The conductive connection layer 150 fills the first via hole 141 and the second via hole 142 such that the gate line 130 is connected to the gate electrode 120 via the conductive connection layer.

In an embodiment, each gate line 130 drives a gate electrode 120 to which the gate line corresponds (FIG. 1 only schematically illustrates a cross section view 120 of one gate electrode), and each gate electrode 120 corresponds to a thin film transistor TFT.

Figure 2:
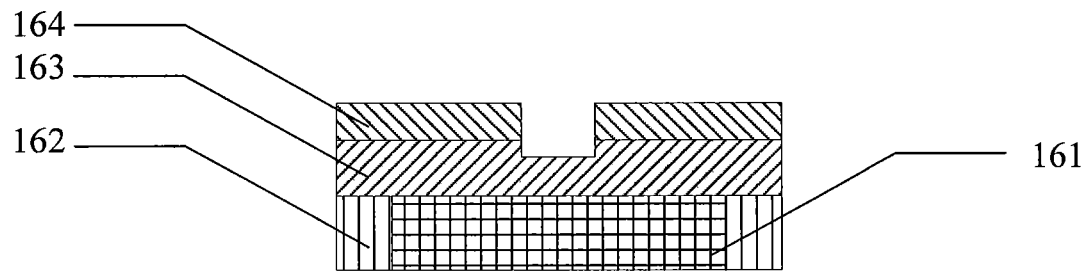
FIG. 2 is a schematic structural view of an active layer provided by an embodiment of the disclosure.

According to an embodiment of the present disclosure, referring to FIG. 2, the array substrate further comprises a first amorphous silicon semiconductor layer 163 and an n-type polysilicon semiconductor layer 164 above the polysilicon semiconductor layer 161. In another embodiment, the array substrate may further comprise a second amorphous silicon semiconductor layer 162 in the same layer as the polysilicon semiconductor layer 161. Specifically, an orthographic projection of the polysilicon semiconductor layer 161 on the base substrate at least partially overlaps that of the gate electrode on the base substrate. In this case, the polysilicon semiconductor layer 161, the second amorphous silicon semiconductor layer 162, the first amorphous silicon semiconductor layer 163, and the n-type polysilicon semiconductor layer 164 form an active layer 160 (refer to FIG. 1). The first amorphous silicon semiconductor layer 163 is mainly used to reduce a leakage current, and the n-type polysilicon semiconductor layer 164 is mainly used to increase an on-state current.

In the embodiments of the disclosure, by setting the gate electrodes apart from the gate lines, the gate electrodes and the gate lines are in a non-connected state when the polysilicon semiconductor layer is being prepared (at that time when the conductive connection layer 150 is not formed), so that at least a large amount of heat can be prevented from being transferred to the gate lines, which can alleviate or relieve the problem regarding diffusion of the laser energy for converting the amorphous silicon semiconductor layer so that the laser can irradiate the amorphous silicon layer more concentratedly and raise the temperatures of the gate electrodes in a short time. This can improve the conversion efficiency of polysilicon and the utilization efficiency of the laser energy, and realize the effect of preparing a polysilicon semiconductor having a larger grain size and a higher mobility using fewer laser sources.

In an embodiment, the polysilicon semiconductor layer 161 disposed corresponding to the gate electrode is a p-type polysilicon semiconductor layer.

In an embodiment, in order to shorten the preparation time and improve the efficiency, the conductive connection layer 150 and the source/drain 170 may be simultaneously formed by the same patterning process. That is, the conductive connection layer 150 and the source/drain 170 may be disposed in the same layer, and the materials for forming the conductive connection layer 150 and the source/drain 170 may be the same conductive material.

Further, in an embodiment, the gate electrode 120 and the gate line 130 may be prepared simultaneously. That is, the gate electrode 120 and the gate line 130 are disposed in the same layer, and the materials for forming the gate electrode 120 and the gate line 130 may be the same conductive material. This further contributes to shortening the process time and improving the efficiency of preparing an array substrate. The "layer" mentioned in "in the same layer" refers to a layer structure formed by forming a film with the same film formation process, and then forming a pattern based on the film by a patterning process using only one mask plate. Depending on the specific patterns, the single patterning process may involve multiple exposure, development or etching processes. The patterns formed in the layer structure may be continuous or discontinuous, and these patterns may also be at different heights or have different thicknesses.

Another embodiment of the disclosure provides a display panel comprising the array substrate according to any of the foregoing embodiments. Specifically, the array substrate is a bottom gate type low temperature polysilicon substrate.

Figure 3:
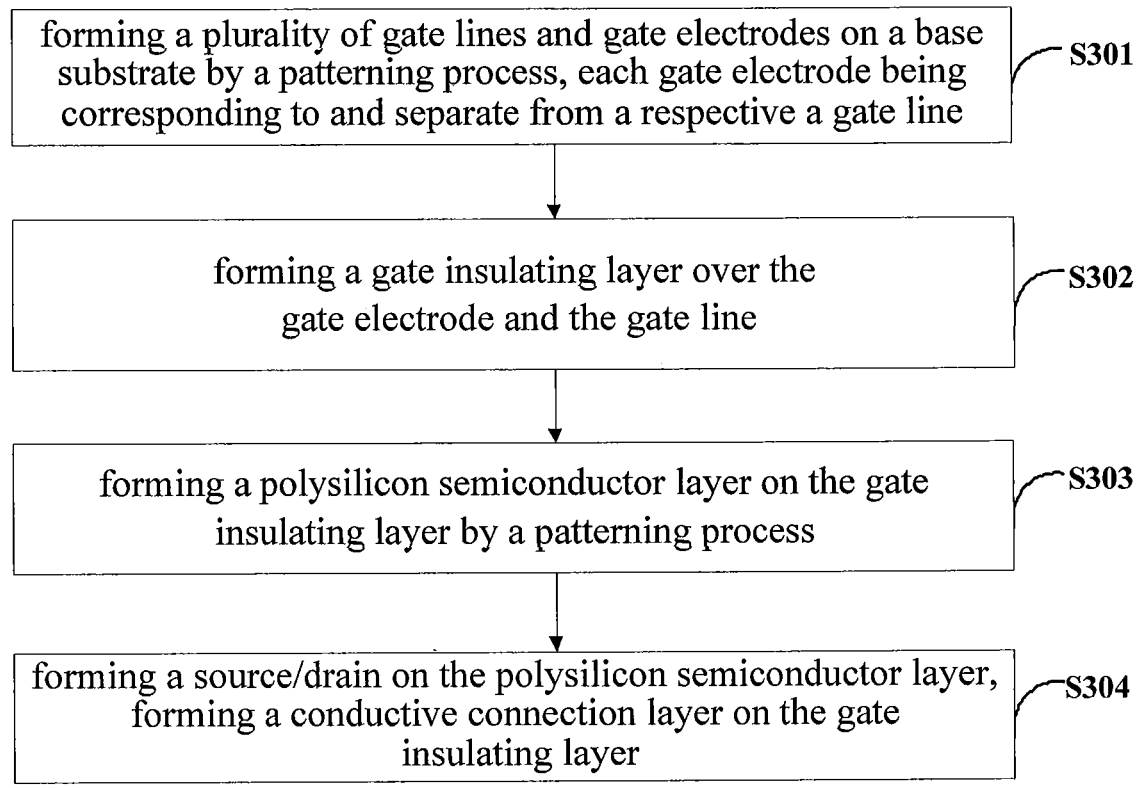
FIG. 3 is a flow chart of a method for manufacturing an array substrate provided by an embodiment of the disclosure.
Figure 4A:
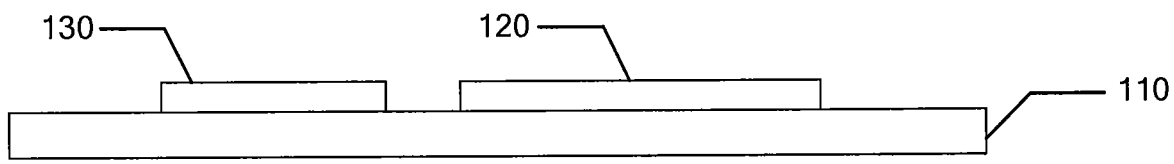
FIG. 4a is a view for illustrating a positional relationship between a gate electrode and a gate line according to an embodiment of the disclosure.

Referring to FIG. 3, a further embodiment of the disclosure provides a method for manufacturing an array substrate, comprising:

S301, forming, on a base substrate, multiple gate lines and gate electrodes, each gate electrode being corresponding to and separate from each gate line. There is an interval between the gate electrode and the gate line, e.g., as shown in FIG. 4a.

S302, forming a gate insulating layer on the gate electrodes and the gate lines;

S303, forming a polysilicon semiconductor layer on the gate insulating layer;

S304, forming a source and a drain on the polysilicon semiconductor layer and forming a conductive connection layer on the gate insulating layer.

Figure 4B:
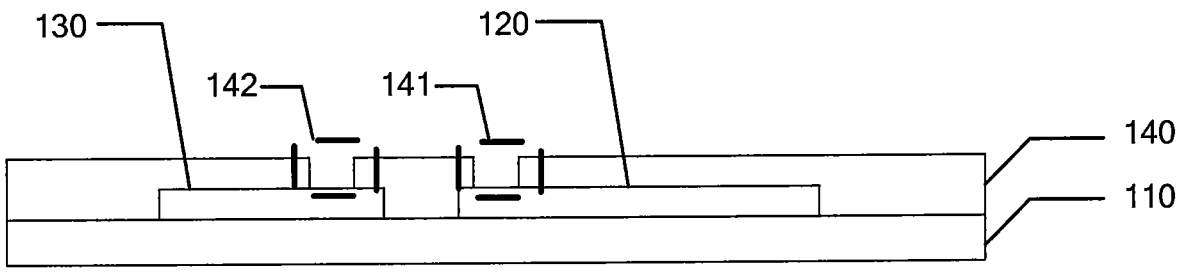
FIG. 4b is a view for illustrating a first via hole and a second via hole in a gate insulating layer of an array substrate according to an embodiment of the disclosure.

In an embodiment, the conductive connection layer may fill a first via hole 141 and a second via hole 142 in the gate insulating layer to connect the gate line to the gate electrode, the first via hole exposes the gate electrode, and the second via hole exposes the gate line. An example of the positional relationship between the first via hole 141 and the second via hole 142 may refer to FIG. 4*b*.

In an embodiment, the first via hole and the second via hole in the gate insulating layer may be formed while the gate insulating layer is being formed, or may be formed after the gate insulating layer is formed, which is not limited herein. However, the conductive connection layer is formed after the polysilicon semiconductor layer is formed.

That is, the method for preparing the first via hole and the second via hole at least includes two examples. In one example, the first via hole and the second via hole are formed while the gate insulating layer is being formed, that is, a gate insulating layer including a first via hole and a second via hole is formed by a patterning process, the first via hole exposing the gate electrode, and the second via hole exposing the gate line.

Forming a gate insulating layer including the first via hole and the second via hole by a patterning process may include the steps of: depositing an insulating material to obtain a first insulating film layer; arranging a mask plate of a predetermined shape on the first insulating film layer; forming a gate insulating layer including the first via hole and the second via hole using the mask plate by means of process such as exposure, development and the like; peeling off the mask plate to obtain a gate insulating layer.

In another example, after the gate insulating layer is formed, a first via hole and a second via hole are formed before the conductive connection layer is formed, that is, the gate insulating layer is etched to obtain a first via hole exposing the gate electrode and a second via hole exposing the gate line.

The method for preparing the first via hole and the second via hole according to the former example can avoid the problem that it takes a long time to form the via holes by etching the gate insulating layer in the latter example, which in turn improves the controllability of the process and the efficiency of preparing an array substrate.

In an embodiment, the above step S303 may include forming a second amorphous silicon semiconductor layer on the gate insulating layer by a patterning process, and performing a local laser annealing process on a region in the second amorphous silicon semiconductor layer corresponding to the gate electrode to form a P-type polysilicon semiconductor layer.

In another embodiment, after step S303, the method further comprises: forming a first amorphous silicon semiconductor layer and an N-type polysilicon semiconductor layer on the P-type polysilicon semiconductor layer successively by a patterning process; forming a metal layer for forming a source and a drain on the N-type polysilicon semiconductor layer by deposition; at that time, the metal layer formed on the N-type polysilicon semiconductor layer is etched to obtain the source and drain; then continuing to etch the n-type polysilicon semiconductor layer and the first amorphous silicon semiconductor layer until the n-type polysilicon semiconductor layer is etched off and the first amorphous silicon semiconductor layer is over-etched; at that time, the etched-off n-type polysilicon semiconductor layer, the over-etched first amorphous silicon semiconductor layer, the p-type polysilicon semiconductor layer, and the second amorphous silicon semiconductor layer around the p-type polysilicon semiconductor layer collectively form an active layer.

In an embodiment, the step of forming a conductive connection layer on the gate insulating layer in step S304 is performed after the polysilicon semiconductor layer is formed.

In an embodiment, a conductive connection layer is formed on the gate insulating layer by the same patterning process while the source and the drain is being formed. That is, the conductive connection layer is formed while forming a metal layer for forming the source and the drain. The local laser annealing process can be a microlens array (MLA) local laser annealing process. The MLA local laser annealing technique only irradiates a region in the amorphous silicon semiconductor layer corresponding to the gate electrode, thus it has higher conversion efficiency than the conventional excimer laser annealing (ELA) technique that irradiates the entire substrate, and the utilization efficiency of the laser for polysilicon conversion is also higher.

In summary, the embodiments of the disclosure provide an array substrate, a manufacturing method thereof, and a display panel. In the embodiments, the gate electrodes and the gate lines are arranged apart from each other, so that the gate electrodes and the gate lines are in a non-connected state when the polysilicon semiconductor layer is being prepared, which avoids or mitigates the problem regarding diffusion of laser energy occurring when the amorphous silicon layer is irradiated with laser to form a polysilicon semiconductor layer. So the laser energy can irradiate the amorphous silicon layer concentratedly and raise the temperatures of the gate electrodes in a short time. This improves the conversion efficiency of polysilicon and the utilization efficiency of the laser energy, and realizes the effect of preparing a polysilicon semiconductor having a larger grain size and a higher mobility using fewer laser resources.

Those skilled in the art can make various modifications and variations to the present disclosure without departing from the spirit and scope thereof. In this way, if these modifications and variations to the present disclosure pertain to the scope of the appended claims of the application and equivalent technologies thereof, the present application intends to encompass these modifications and variations.

In the claims, the wording "comprising" does not exclude existence of other elements or steps. The wording "a" or "an" preceding an element does not exclude a plurality of such elements. The mere fact that certain measures are recited in mutually different dependent claims does not indicate that a combination of these measures cannot be used to advantage.

The invention claimed is:

1. An array substrate comprising: a base substrate, a plurality of gate lines and gate electrodes on the base substrate, each gate electrode corresponding to and separate from a respective gate line, a gate insulating layer over the gate electrodes and the gate lines, the gate insulating layer comprising a first via hole and a second via hole, the first via hole exposing a first gate electrode of the plurality of gate electrodes, the second via hole exposing a first gate line of the plurality of gate lines, and a conductive connection layer on the gate insulating layer, the conductive connection layer filling the first via hole and the second via hole to connect the first gate line with the first gate electrode, wherein the gate electrodes and the gate lines are disposed in a same layer, wherein the array substrate further comprises an active layer on the gate insulating layer, the active layer comprises a p-type polysilicon semiconductor layer, a first amorphous silicon semiconductor layer and an n-type polysilicon semiconductor layer stacked on the gate insulating layer in sequence, and wherein the active layer further comprises a second amorphous silicon semiconductor layer between the gate insulating layer and the first amorphous silicon semiconductor layer.

2. The array substrate according to claim 1, wherein the array substrate further comprises a source/drain on the n-type polysilicon semiconductor layer.

3. The array substrate according to claim 2, wherein the conductive connection layer and the source/drain are disposed in a same layer.

4. The array substrate according to claim 1, wherein an orthographic projection of the p-type polysilicon semiconductor layer on the base substrate at least partially overlaps an orthographic projection of the first gate electrode on the base substrate.

5. A display panel comprising the array substrate according to claim 1.

6. A manufacturing method for the array substrate according to claim 1, comprising: forming the plurality of gate lines and gate electrodes on the base substrate, each gate electrode corresponding to and separate from the respective gate line, forming the gate insulating layer over the gate electrodes and the gate lines, the gate insulating layer comprising the first via hole that exposes the first gate electrode of the plurality of gate electrodes and the second via hole that exposes the first gate line of the plurality of gate lines, and forming the p-type polysilicon semiconductor layer on the gate insulating layer.

7. The method according to claim 6, further comprising: forming a source/drain on the n-type polysilicon semiconductor layer, forming the conductive connection layer on the gate insulating layer, the conductive connection layer filling the first via hole and the second via hole to connect the first gate line with the first gate electrode.

8. The method according to claim 6, wherein forming the gate insulating layer comprises:
forming, by a patterning process, the gate insulating layer comprising the first via hole and the second via hole.

9. The manufacturing method according to claim 6, wherein forming the gate insulating layer comprises:
forming an insulating film covering the gate electrodes and the gate lines, and
etching the insulating film to obtain the first via hole that exposes the first gate electrode and the second via hole that exposes the first gate line.

10. The manufacturing method according to claim 6, wherein forming the p-type polysilicon semiconductor layer on the gate insulating layer comprises:
forming, by a patterning process, the second amorphous silicon semiconductor layer on the gate insulating layer, and performing a local laser annealing process on a region in the second amorphous silicon semiconductor layer corresponding to the first gate electrode to form the p-type polysilicon semiconductor layer.

11. The manufacturing method according to claim 10, wherein the local laser annealing process is a microlens array (MLA) local laser annealing process.

12. The manufacturing method according to claim 7, wherein the conductive connection layer is formed on the gate insulating layer by a same patterning process used to form the source/drain.

13. The manufacturing method according to claim 6, the method further comprising: forming the first amorphous silicon semiconductor layer and the n-type polysilicon semiconductor layer on the p-type polysilicon semiconductor layer.

14. The manufacturing method according to claim 6, wherein an orthographic projection of the p-type polysilicon semiconductor layer on the base substrate at least partially overlaps that of the first gate electrode on the base substrate.

* * * * *